United States Patent
Dhindsa et al.

(10) Patent No.: US 8,080,760 B2
(45) Date of Patent: Dec. 20, 2011

(54) APPARATUSES FOR ADJUSTING ELECTRODE GAP IN CAPACITIVELY-COUPLED RF PLASMA REACTOR

(75) Inventors: Rajinder Dhindsa, San Jose, CA (US); Eric H. Lenz, Pleasanton, CA (US); Andy W. DeSepte, San Jose, CA (US); Lumin Li, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 168 days.

(21) Appl. No.: 12/693,066

(22) Filed: Jan. 25, 2010

(65) Prior Publication Data

US 2010/0124822 A1    May 20, 2010

Related U.S. Application Data

(63) Continuation of application No. 11/653,869, filed on Jan. 17, 2007, now Pat. No. 7,732,728.

(51) Int. Cl.
*B23K 10/00* (2006.01)

(52) U.S. Cl. ......... 219/121.48; 219/121.43; 219/121.58; 156/345.33; 156/345.51

(58) Field of Classification Search ............... 219/121.4, 219/121.43, 121.44, 121.48, 121.58; 315/111.21, 315/111.51; 156/345.32, 345.33, 345.47, 156/345.51
See application file for complete search history.

(56) References Cited

U.S. PATENT DOCUMENTS

| | | | |
|---|---|---|---|
| 5,820,723 A | 10/1998 | Benjamin et al. | |
| 5,948,704 A | 9/1999 | Benjamin et al. | |
| 6,019,060 A | 2/2000 | Lenz | |
| 6,170,428 B1 | 1/2001 | Redeker et al. | |
| 6,270,618 B1 | 8/2001 | Nakano et al. | |
| 6,962,664 B2 | 11/2005 | Mitrovic | |
| 2003/0141017 A1 | 7/2003 | Fujisato | |
| 2004/0182505 A1 | 9/2004 | Sato | |
| 2005/0050327 A1 | 3/2005 | Okamoto | |
| 2005/0051520 A1 | 3/2005 | Tanaka | |
| 2008/0276958 A1 | 11/2008 | Mehta et al. | |

FOREIGN PATENT DOCUMENTS

| | | |
|---|---|---|
| JP | 2001-077088 A | 3/2001 |
| JP | 2001-284332 A | 10/2001 |
| KR | 10-0345420 B1 | 11/2002 |
| KR | 10-2003-0051698 A | 6/2003 |

OTHER PUBLICATIONS

Official Action issued Apr. 14, 2010 for Chinese Appln. No. 200880002547.8.
International Search Report and Written Opinion mailed Jun. 4, 2008 for PCT/US2008/000001.

*Primary Examiner* — Mark Paschall
(74) *Attorney, Agent, or Firm* — Buchanan Ingergoll & Rooney PC

(57) ABSTRACT

A plasma processing chamber includes a cantilever assembly configured to neutralize atmospheric load. The chamber includes a wall surrounding an interior region and having an opening formed therein. A cantilever assembly includes a substrate support for supporting a substrate within the chamber. The cantilever assembly extends through the opening such that a portion is located outside the chamber. The chamber includes an actuation mechanism operative to move the cantilever assembly relative to the wall.

15 Claims, 4 Drawing Sheets

APPARATUSES FOR ADJUSTING ELECTRODE GAP IN CAPACITIVELY-COUPLED RF PLASMA REACTOR

CROSS-REFERENCE TO RELATED APPLICATIONS

This application is a continuation application of U.S. application Ser. No. 11/653,869 entitled APPARATUSES FOR ADJUSTING ELECTRODE GAP IN CAPACITIVELY-COUPLED PLASMA REACTOR, filed on Jan. 17, 2007, now U.S. Pat. No. 7,732,728 the entire content of which is hereby incorporated by reference.

BACKGROUND

Integrated circuits are typically formed from a wafer over which are formed patterned microelectronics layers. In the processing of the substrate, plasma is often employed to deposit films on the substrate or to etch intended portions of the films. Shrinking feature sizes and implementation of new materials in next generation microelectronics layers have put new demands on plasma processing equipment. The smaller features, larger substrate size and new processing techniques create additional demands on control of the plasma parameters, such as plasma density and uniformity across the substrate, to achieve desired yields.

SUMMARY

An exemplary embodiment of a plasma processing apparatus comprises a chamber comprising a wall surrounding an interior region and having an opening; a cantilever assembly comprising: an arm unit extending through the opening of the wall and having an outer portion located outside the interior region; and a substrate support on the arm unit and disposed within the interior region; an actuation mechanism coupled to the outer portion of the arm unit and operative to move the cantilever assembly relative to the wall; and at least one vacuum isolation member enclosing a space partially surrounded by the outer portion of the arm unit and the wall and being in fluid communication with the interior region, the vacuum isolation member providing vacuum isolation for the space such that an atmospheric load on the cantilever assembly is neutralized.

An exemplary embodiment of a plasma processing chamber for processing a substrate comprises a wall surrounding an interior region and having an opening; a cantilever assembly extending through the opening, the cantilever assembly including a substrate support surface at a first end inside the interior region and a second end outside the interior region; and an actuation mechanism coupled to the second end and operative to move the cantilever assembly in reverse directions perpendicular to the substrate support surface.

An apparatus for adjusting an inter-electrode gap in a capacitively-coupled plasma processing chamber comprising an upper electrode assembly and a wall surrounding an interior region and having an opening, the apparatus comprising a cantilever assembly including a lower electrode, a substrate support surface at a first end and a second end, the cantilever assembly being adapted to extend through the opening such that the first end is inside the interior region and the second end is outside the interior region; and an actuation mechanism coupled to the second end and operative to move the cantilever assembly perpendicular to the substrate support surface.

DRAWINGS

DETAILED DESCRIPTION

Figure 1:
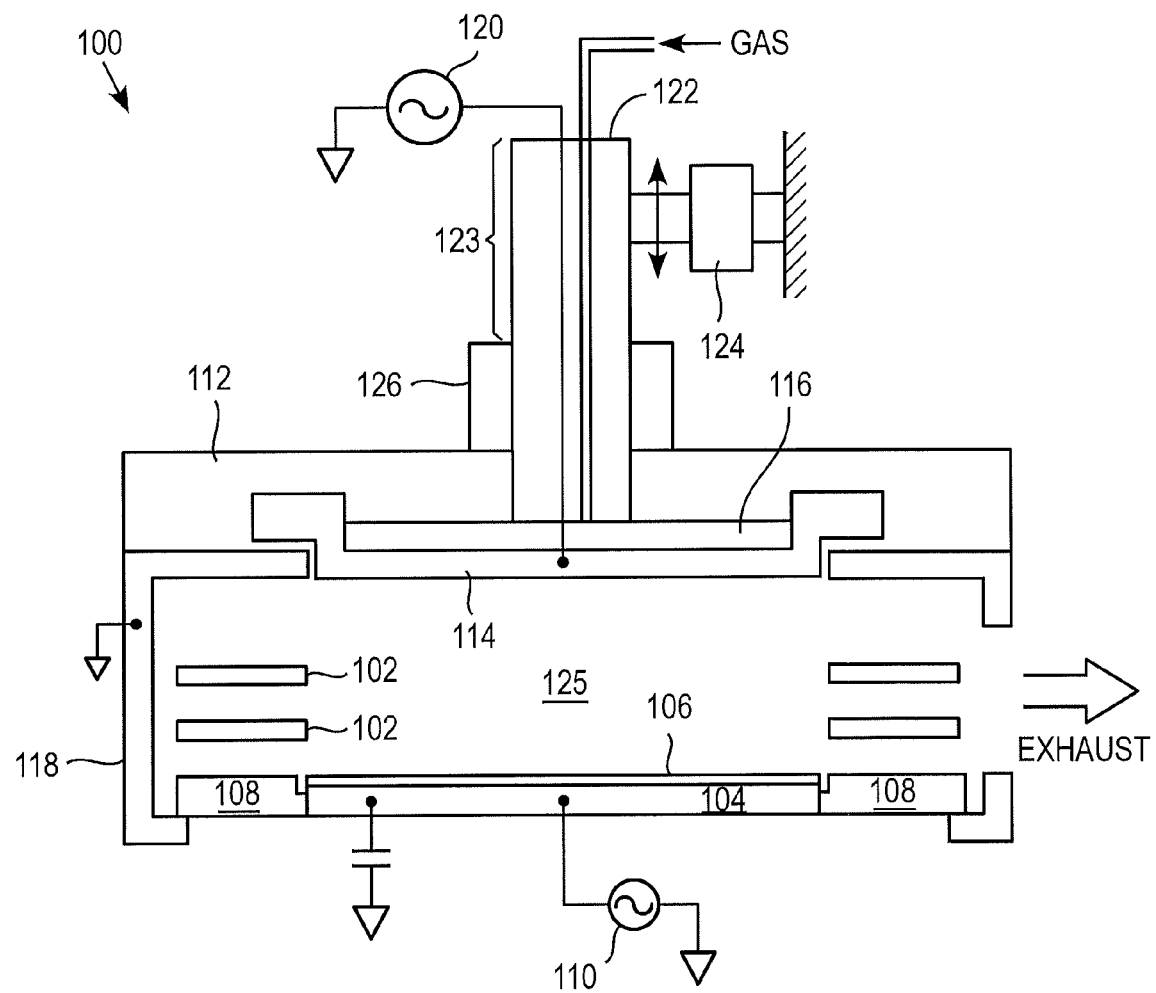
FIG. 1 shows a schematic diagram of a capacitively-coupled plasma processing chamber.

FIG. 1 illustrates a capacitively-coupled plasma processing chamber 100 of a plasma processing apparatus. As depicted, a lower electrode assembly includes a focus ring 108; and a chuck 104 for holding a substrate 106 in place during operation of the chamber. The chuck 104 is supplied radio frequency (RF) power by an RF power supply 110. In the illustrated chamber 100, the lower electrode assembly is fixed to the chamber wall 118. An upper electrode assembly includes an upper electrode 114; a baffle 116; and a cylindrical body 123 from which the upper electrode and baffle suspend. The upper electrode 114 can be grounded or powered by another RF power supply 120 during operation. Gas supplied through the baffle 116 and upper electrode 114 is electrically excited to produce plasma in the gap 125. Plasma in the gap 125 is confined by confinement rings 102. Some of the gas in the plasma passes through spacing/gaps between the confinement rings 102 and is exhausted from the chamber.

In the illustrated chamber 100, to adjust the gap 125 between the lower and upper electrode assemblies, the entire upper electrode assembly is raised or lowered by an actuator mechanism 124. A sealing arrangement 126 may be used to provide a vacuum seal between the cylindrical body 122 and the reactor top 112 while allowing the upper electrode assembly to move relative to the lower electrode assembly. A portion 123 of the cylindrical body 122 is subject to atmospheric pressure, while the remainder of the upper electrode assembly is subject to low pressures. As the upper electrode assembly moves as one integral body, the summation of pressure on the surface of the upper electrode assembly yields a downward force, referred to as atmospheric load. In other types of chambers, the lower electrode assembly may be moved up and down to adjust the gap, while the upper electrode may be stationary. In such chambers, because the top and bottom sides of the lower electrode assembly are respectively subject to a low pressure and atmospheric pressure, the lower electrode assembly is subject to an atmospheric load directed upwardly.

In the embodiment, the atmospheric load depends on parameters including the diameter of the upper electrode 114, the cross-sectional dimension of the cylindrical body 122, the pressure of the plasma in the gap 125, and the chamber pressure within the top 112. Because the atmospheric load is present while moving the upper (or lower) electrode assembly, and the atmospheric load can vary, it is desirable to have a capacitively-coupled chamber that can neutralize the atmospheric load, to thereby allow the gap to be controlled more accurately.

Figure 2:
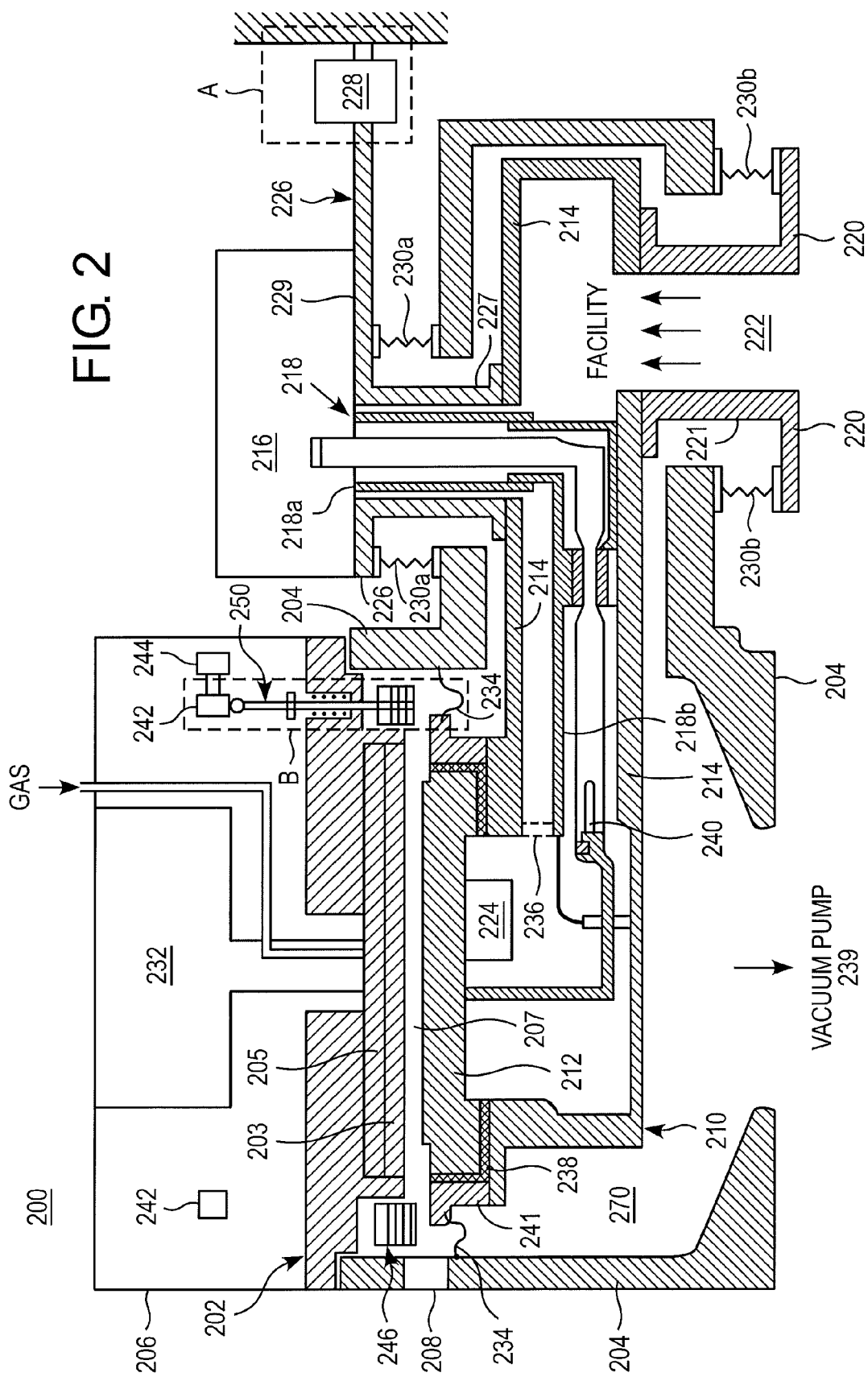
FIG. 2 is a schematic cross-sectional diagram of an embodiment of a capacitively-coupled plasma processing chamber including a cantilever assembly.

FIG. 2 shows an exemplary embodiment of a capacitively-coupled plasma (CCP) processing chamber 200 of a plasma processing apparatus. The chamber 200 can neutralize the atmospheric load to allow accurate control of the electrode gap. The chamber 200 comprises a wall 204; an upper electrode assembly 202 mounted to the wall; and a chamber top 206 enclosing the top portion of the upper electrode assembly 202. The upper electrode assembly 202 comprises an upper electrode 203; and one or more baffles 205 including gas passages for distributing process gas into a gap 207 defined between the upper electrode 203 and the lower electrode assembly 212. For brevity, the upper electrode assembly 202 is shown to have three components. However, the upper electrode assembly can include additional components. The wall 204 has a gate 208 through which substrates are unloaded/loaded into the chamber 200.

For brevity, only one gas line is shown in FIG. 2. Additional gas lines can be coupled to the upper electrode assembly 202, and the gas can be supplied through other portions of the chamber wall 204 and/or the chamber top 206.

The chamber 200 comprises a cantilever assembly 210 that is raised or lowered by an actuation mechanism 228. The cantilever assembly 210 includes a cantilever arm 214, outer conducting ring 241, the lower electrode assembly 212, and an insulator 238 for electrically insulating the outer conducting ring 241 from the lower electrode assembly 212. The lower electrode assembly 212 is shown to have one component. However, the lower electrode assembly 212 can include additional components, such as a lower electrode and chuck for holding a substrate in place on the top surface of the lower electrode assembly 212 during operation. The chuck can be an electrostatic, vacuum, or mechanical chuck. The lower electrode is typically supplied with RF power from one or more RF powder supplies 216. The RF power can have a frequency of, for example, 2 MHz to about 27 MHz. The RF power excites the process gas to produce plasma in the gap 207. Other suitable mechanisms, such as a lift pin mechanism for lifting the substrate, optical sensors, and a cooling mechanism for cooling the lower electrode assembly 212, are attached to or form portions of the lower electrode assembly 212. The facility components 224 collectively represent these other types of mechanisms.

The arm 214 can have a generally cylindrical tube shape. The arm 214 is preferably formed of a conducting material. As the outer surface of the arm 214 is exposed to reactive process gases, the arm 214 can have an outer protective coating, or can be formed of a material, such as stainless steel, that can withstand process gas. The cantilever assembly 210 also includes an upper arm support 226 and a lower arm support 220 secured to the arm 214. Hereinafter, the arm 214, upper arm support 226, and lower arm support 220, are also collectively referred to as an arm unit. As the upper arm support 226 and lower arm support 220 are located outside the side wall 204, these components are also referred to herein as an outer portion of the arm unit. The lower arm support 220 includes a cylindrical tube portion 221 that forms a supply line path 222. Facility supply lines, such as coolant pipes, pneumatic lines, sensor input/output lines, for the facility components 224 pass through the supply line path 222 extending from the inner space of the cylindrical tube portion 221 of the lower arm support 220 to the bottom surface of the lower electrode assembly 212. The supply line path 222 forms a cavity inside the cantilever assembly 210 and is open to the atmosphere. The lower arm support 220 can be formed of conducting material.

The upper arm support 226 includes a generally cylindrical tube portion 227 and a top plate 229. One end of the top plate 229 is secured to the actuation mechanism 228. The top plate 229 also supports the RF supply or match 216. The cylindrical tube portion 227 of the upper arm support 226 and the arm 214 provide a space for accommodating an L-shaped RF tube assembly 218. The components of the cantilever assembly 210, i.e., the lower electrode assembly 212; arm 214; RF tube assembly 218; lower and upper arm supports 220, 226; outer conductor ring 241; and insulator 238 are moved up and down as one integral body by the actuation mechanism 228 so that the gap 207 is adjusted. Further details of the actuation mechanism 228 are described below in conjunction with FIG. 3.

The bottom of the wall 204 is coupled to a vacuum pump unit 239 for exhausting gas from the chamber. The chamber 200 includes at least one vacuum isolation member to provide vacuum isolation for the cantilever assembly 210. In the illustrated embodiment, the vacuum isolation member comprises two bellows 230a, 230b. The outer surfaces of the lower and upper arm supports 220, 226, and the outer surface of the arm 214 are subject to lower pressures generated by the vacuum pump unit 239. Considering a substrate as a part of the cantilever assembly 210, it can be realized that most of the outer surface of the cantilever assembly 210 is located within low pressure regions during operation. As such, the atmospheric load on the cantilever assembly 210, i.e., the total gas pressure around the outer surface of the cantilever assembly 210, is insignificant, i.e., the atmospheric load is neutralized. As the atmospheric load is neutralized in the embodiment, the cantilever assembly 210 delivers a reduced load to the actuation mechanism 228.

Process gas injected into the gap 207 is energized to produce plasma to process the substrate, passes through the confinement ring assembly 246, and stays in the space surrounding the outer surfaces of the lower arm support 220, upper arm support 226, and arm 214 until exhausted by the vacuum pump unit 239. As the upper and lower arm supports 220, 226 are exposed to reactive process gas during operation, they are formed of material, such as stainless steel, that can withstand the process gas or have protective coatings. Likewise, the bellows 230a, 230b are formed of a material that can withstand the chemistry, such as stainless steel. The diameter of the bellows 230a, 230b may vary depending on the design requirements and can be about 1.6 cm to about 3.6 cm, for instance.

The cantilever assembly 210 is raised or lowered to adjust the gap 207 between the upper electrode assembly 202 and a substrate mounted on the lower electrode assembly 212. To decrease the gap 207, the cantilever assembly 210 is raised to compress the upper bellows 230a and to stretch the lower bellows 230b. Likewise, to increase the gap 207, the cantilever assembly 210 is lowered to stretch the upper bellows 230a and to compress the lower bellows 230b.

In the embodiment, the volume of the region of the chamber 200 at vacuum pressure substantially does not change during vertical movement of the cantilever assembly 210, which is entirely within the volume defined by the inner surface of the wall 204, the outer surface of the cantilever assembly 210, and bellows 230a, 230b. The volume can be maintained substantially constant because when the cantilevered assembly 210 is moved upwardly, bellows 230a expands and bellows 230b contracts, thereby maintaining substantially the same volume within the vacuum region. As shown in FIG. 2, although the bellows 230a, 230b are slightly off center with respect to their vertical axes, the dual bellows balance the atmospheric load by maintaining the internal volume of the chamber 200 substantially constant at various vertical positions of the cantilevered assembly 210. In this way, atmospheric pressure on the top of the cantilevered assembly above the chamber 200 counteracts the atmospheric pressure acting on the interior of supply line path 222.

Because the volume change is insignificant during the gap adjustment and the atmospheric load is balanced, there is reduced fluctuation of the chamber pressure and plasma pressure. Thus, the atmospheric load has minimal influence on process conditions within the chamber 200.

As described above, the facility supply lines pass through the supply line path 222. The supply line path 222 extends from the cylindrical tube portion 221 of the lower arm support 220 through the arm 214 to the facility components 224 located under the lower electrode assembly 212. The support line path 222 is open to the atmosphere. However, as the path 222 forms a cavity in the cantilever assembly 210, the summation of the atmospheric pressure on the cavity surface does not yield any atmospheric load.

The RF supply 216 supplies RF power to the lower electrode assembly 212 during operation. The RF supply 216 sends RF energy through the L-shaped RF tube assembly 218. The upper section 218a of the RF tube assembly 218 is located inside the cylindrical portion 227 of the upper arm support 226, while the lower section 218b is located inside the arm 214. The bottom portion of the upper section 218a is coupled to an open end of the lower section 218b to form a cavity for RF transmission. The RF tube assembly 218 is formed of a suitable conducting material. An RF conductor 240 located near the closed end of the lower section 218b collects the RF energy transmitted through the RF tube assembly 218 and sends the collected energy to the lower electrode assembly 212.

The level of RF matching between the RF supply 216 and RF conductor 240 depends on the dimension of the RF tube assembly 218. The lengths and diameters of the upper and lower sections 218a, 218b of the RF tube assembly 218 preferably have optimum values so that the RF power delivered through the tube assembly 218 is optimized in a wide RF frequency range. In the illustrated embodiment, both the upper section 218a and the lower section 218b of the RF tube assembly 218 are moved with the RF supply 216 during the gap adjustment. Thus, once the RF tube assembly 218 is set to its optimum configuration, the configuration can be maintained without further adjustment, resulting in enhanced performance of the chamber 200 over a wide range of RF frequency.

In the embodiment, vertical movement of the cantilevered assembly 210 (i.e., vertical to the substrate support surface provided on the arm 214) can be effected without sliding parts inside the chamber 200. Consequently, the cantilevered assembly 210 reduces potential for particle generation during gap adjustment. For instance, because the upper end of one end of the horizontal arm 214 is located outside the chamber, the horizontal arm 214 and substrate support can be raised and lowered as a unit without use of a vertical drive mechanism inside the chamber, or sliding parts to accommodate expansion of a bottom electrode assembly. Likewise, because software used to control supply of RF power to the lower electrode moves as a unit with the horizontal arm and substrate support, the RF supply line can be made from rigid conducting materials at a preset length as there is no need to accommodate movement between the lower electrode and the RF supply, which otherwise occurs when the software is located on a fixed surface outside a plasma chamber.

The gas in the gap 207 is electrically excited to produce plasma by the RF power delivered to the lower electrode assembly 212. The return current, which is the current flowing from the lower electrode assembly 212 through the plasma to the upper electrode assembly 202, needs to return back to the RF supply 216 to complete a current loop. In the chamber 200, several flexible contacts or strips 234 are used to make secure electrical connection between the wall 204 and the outer conductor ring 241 that is electrically coupled to the arm 214. The outer conductor ring 241 is formed of conducting material and electrically separated from the lower electrode assembly 212 by the insulator 238. The return current completes the loop by flowing from the upper electrode assembly 202 through the wall 204, flexible contacts 234, outer conductor ring 241, arm 214, wall or shield of the RF tube assembly 218, to the RF supply 216. The bellows 230a, 230b do not form a part of the circuit for the return current. A conductor component 236 is used to electrically connect the arm 214 to the wall of RF tube assembly 218, providing an additional path for the return current.

As the outer conductor ring 241 moves relative to the wall 204 during gap control or substrate loading/unloading, the contacts 234 are sufficiently flexible to accommodate the relative motion. The flexible contacts 234 are preferably formed from a metal alloy, such as beryllium copper (BeCu). Optionally, the contacts 234 can have a plasma resistant coating to protect them from reactive process gases. The flexible contacts 234 are stretched or compressed due to the relative motion between the wall 204 and conductor ring 241. The contacts 234 may have a curved shape to provide stress relief.

As described above, process gas is excited to produce plasma in the gap 207. Once plasma is generated in the gap 207, the confinement ring assembly 246 is operable to confine the plasma at different pressures and gas flow conditions. In the embodiment, the confinement ring assembly 246 is actuated by a CAM ring/plunger assembly 250. The CAM ring/plunger assembly 250 includes a CAM ring 242; a motor 244 for rotating the CAM ring 242; and plunger assemblies coupled to the CAM ring 242 and confinement ring assembly 246. Further details of the confinement ring assembly 246 and CAM ring/plunger assembly 250 are described below in conjunction with FIGS. 4 and 5.

In general, patterning microelectronic layers on substrates includes several etching/deposition steps. During the several steps, successive byproduct layers are deposited on the surfaces of the upper and lower electrode assemblies. As the bonds between the byproduct layers and the assembly surfaces eventually weaken, the byproduct layers may peel or flake off from the surfaces to contaminate the substrate. In the chamber 200, the upper electrode assembly 202 remains fixed while the cantilever assembly 210 is moved in the vertical direction to adjust the gap 207 between the lower and upper electrode assemblies 212, 202. As such, most of the flakes may fall off from the cantilever assembly 210 during transition between the steps or loading/unloading of substrates. As the substrate is located on top of the cantilever assembly 210, i.e., the substrate is located above the contamination region, the byproduct contamination may be significantly reduced, enhancing the manufacturing yield.

Figure 3:
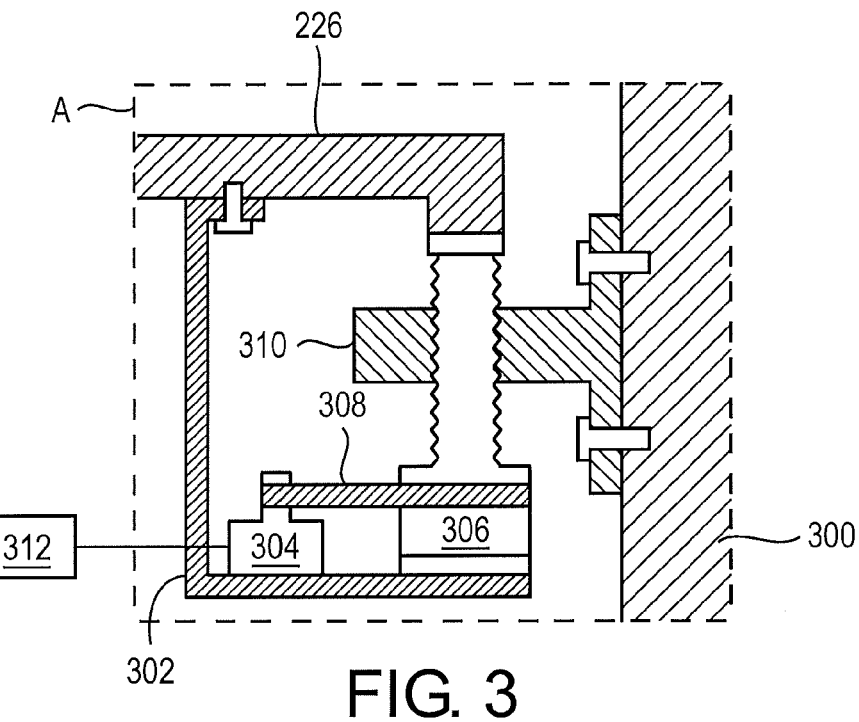
FIG. 3 shows an enlarged view of region A shown in FIG. 2.

FIG. 3 is an enlarged schematic view of region A shown in FIG. 2, illustrating the actuation mechanism 228 (FIG. 2) for moving the cantilever assembly 210. As depicted, an end portion of the upper arm support 226 is rotatably secured to the tip of a lead screw or ball screw 306. A motor 304 secured to a support bracket 302 actuates the lead screw 306 via a belt 308 or other suitable motion transmission mechanism. The bottom of the screw 306 is rotatably secured to the bracket 302. Guide 310 has a female threaded hole which mates with the lead screw 306. Because the guide 310 is secured to a wall 300, a rotational motion of the lead screw 306 generates a vertical motion of the upper arm support 226, support bracket 302, and motor 304. The type of motor 304 and the pitch of the threads formed in the screw 306 affect the degree of precision in adjusting the gap 207, preferably to few tenths of microns. The motor 304 is controlled by a motor control system 312. The motor control system 312 can be coupled to a sensor for measuring the size of the gap 207 so that the gap control is performed in a feedback control mode. Various types of in-situ detectors, such as laser, inductive, capacitive, acoustic, linear variable differential transformer (LDVT) sensors, can be used as a gap sensor and located either inside or outside the wall 204, depending on the type of sensor.

Figure 4:
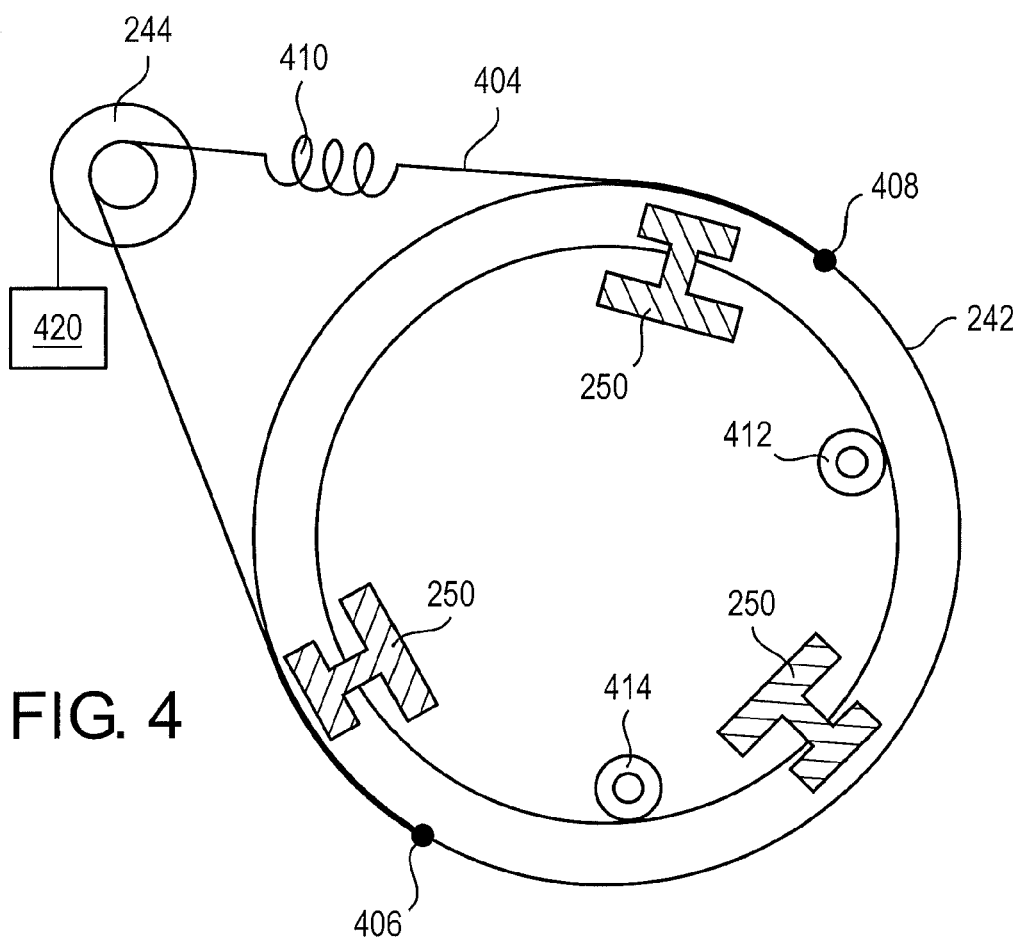
FIG. 4 shows a schematic top view of the CAM ring and motor shown in FIG. 2.

FIG. 4 is a schematic top view of the CAM ring 242 and motor 244 shown in FIG. 2. As depicted, the motor 244 is coupled to the CAM ring 242 via a belt 404. The belt 404 is attached to the CAM ring 242 at points 406 and 408. In an alternative embodiment, the belt 404 can wrap around the CAM ring 242. A tensioning arrangement 410 takes up the slack in the belt 404 and pulls the CAM ring 242 toward motor 244 to urge the inner surface of the CAM ring 242 to be in rolling contact with rollers 412 and 414. Three plunger assemblies 250 are coupled to the CAM ring 242. The plunger assemblies 250 actuate the confinement ring assembly 246, as described below in conjunction with FIG. 5. The motor 244 is controlled by a motor control unit 420.

The chamber 200 can include one or more pressure sensors for measuring the pressure in the gap 207 as well as in the space 270 between the chamber wall 204 and the cantilever assembly 210. Signals from the sensor(s) are sent to the motor control unit 420. The motor control unit 420 is coupled to the pressure sensors, such that signals from the sensor(s) are sent to the motor control unit 420. As the chamber pressure is partially controlled by the confinement ring assembly 246, the motor control unit 420 and pressure sensor can operate in a feedback control mode.

Additional rollers can be used to define the center of rotation of the CAM ring 242. Three plunger assemblies 250 are shown disposed about the CAM ring 242. However, other embodiments can include a different number of plunger assemblies.

Figure 5:
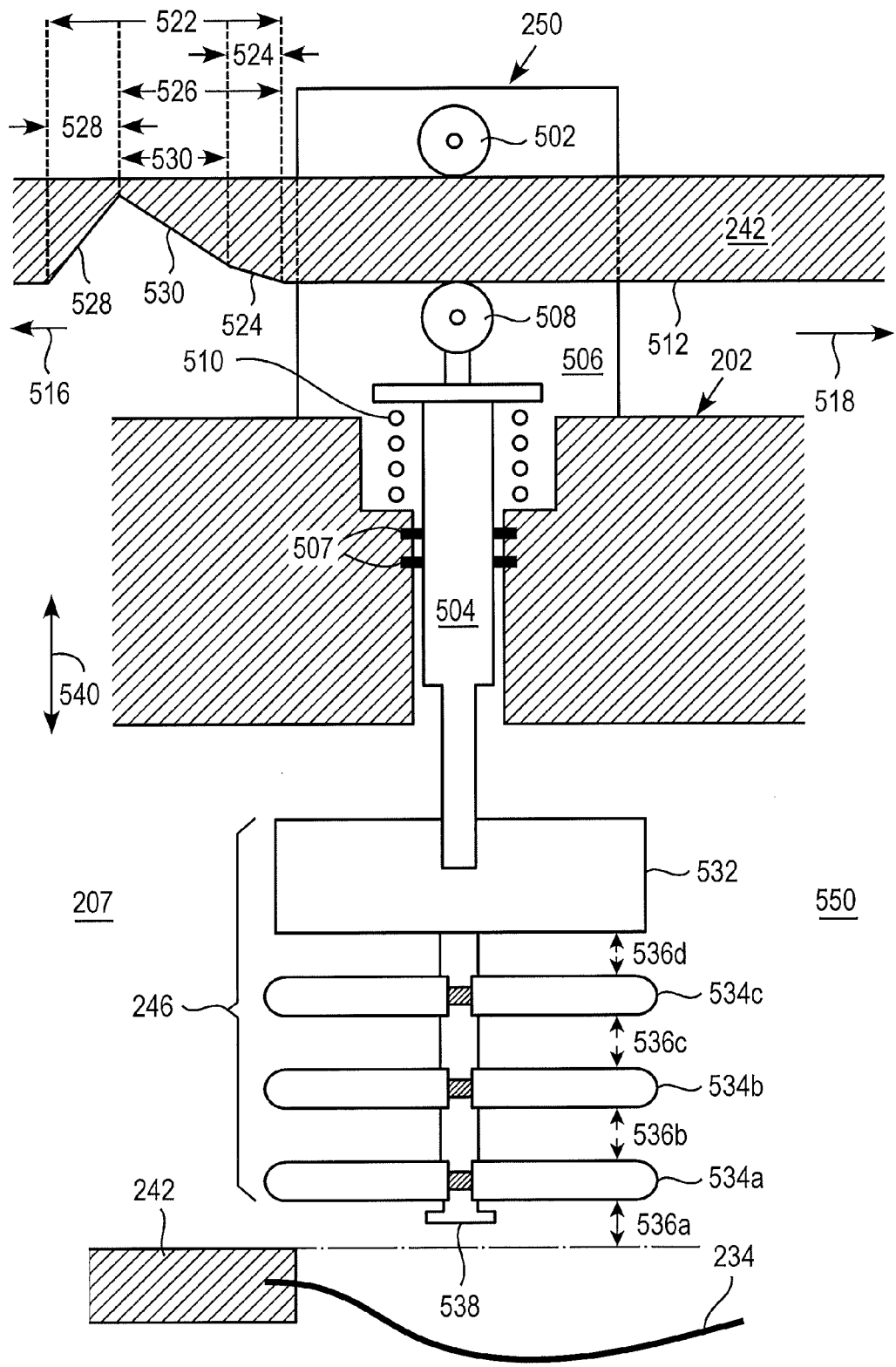
FIG. 5 shows an enlarged schematic view of region B shown in FIG. 2.

FIG. 5 is an enlarged schematic view of region B shown in FIG. 2. As depicted, the plunger assembly 250 includes a wheel 502, which is shown to be in rolling contact with the CAM ring 242; and a backing plate 506. The wheel 502 is adjustably mounted on the backing plate 506 via a suitable mechanism, such as bolt-and-slot arrangement. The backing plate 506 is mounted on the chamber top 206 (FIG. 2) and is essentially immobile with respect to the chamber top 206.

The assembly 250 also includes a plunger 504 and a CAM follower 508 mounted on the plunger 504. The plunger 504 and CAM follower 508 are urged toward a lower surface 512 of the CAM ring 242 by a spring 510. The CAM follower 508 stays in contact with the lower surface 512 to permit the plunger 504 to rise or fall with the contours in the lower surface 512. The plunger 504 moves up and down in a direction 540, which is orthogonal to the plane defined by the WAP ring 532 and confinement rings 534.

A pair of seals 507 mounted in grooves formed in the upper electrode assembly 202 permit the lower pressure within the chamber to be maintained as plunger 504 moves up and down following the contour in the lower surface 512 of the CAM ring 242. Although two seals 507 are shown, other suitable number of seals can be employed as desired.

Vertical motion of the plunger 504 is controlled by the contour in the lower surface 512 of the CAM ring 242. As depicted in FIG. 5, the lower surface 512 includes a CAM region 522. There is preferably one CAM region for every plunger assembly 250. The CAM region 522 preferably includes an inclining surface 526, which causes the plunger 504 to be moved downward as the CAM ring 242 rotates in the direction of arrow 518. Alternatively, the declining surface 528 is not employed for controlling the plunger 504. Instead, the plunger 504 is moved upward and downward by employing only the inclining surface 242 as the CAM ring 504 is rotated back and forth and the CAM follower 508 follows the contour of the inclining surface 526.

The inclining surface 526 can have two separate regions having two different slopes. As shown, the first slope 530 is steeper than the second slope 524 to allow the plunger 504 to move upward and downward a greater distance per degree of rotation of the CAM ring 242. The slope 530 may be used for coarse control while the slope 524 is used for fine control of the plunger 504. Alternatively, the inclining surface 526 may have one continuous slope.

The plunger 504 is coupled to the confinement ring assembly 246. More specifically, the bottom end of the each plunger 504 is coupled to the WAP ring 532 and a plurality of confinement rings 534a, 534b, 534c (referred to herein collectively as confinement rings 534). The plungers 504 move in the direction of arrow 540 to thereby control the location of the rings 532, 534 and the gaps 536a, 536b, 536c, 536d (collectively referred to herein as gaps 536) between the rings 532, 534. Process gas is introduced into the gap 207 through the upper electrode assembly 202, which may include one or more baffles so that the process gas flows in the region 207 with a showerhead effect. In the gap 207, the process gas is excited to produce plasma to process a substrate mounted on the top support surface of the lower electrode assembly 212.

The gap 207, which is coaxial with the central axis of the substrate, is spaced from the wall 204 by virtue of the region including the confinement ring assembly 246. The WAP ring 532 is coupled to the ends of plungers 250 and the rings 534 suspend from the WAP ring 532 via a post 538. The rings 532, 534 have a louver arrangement and the gaps 536 between the rings are controlled to confine the plasma over a wide range of the gap 207. As the plungers 504 move upward, the rings 532, 534 get separated from each other. As the plunger 504 moves downward or the cantilever assembly 210 moves upward, the bottom ring 534a comes into contact with the shoulder of the outer conductor ring 242. As the cantilever assembly 210 moves further upward, the gaps 536b-536d sequentially reduce to zero. Alternatively, a spacer may be inserted in each of the gaps 536 to limit the minimum spacing between two neighboring rings 534. Further details of the confinement ring assembly 246 are found in commonly-owned U.S. Pat. No. 6,019,060, which is hereby incorporated by reference in its entirety. The rings 532, 534 are preferably formed of a material having high electrical conductivity, such as silicon carbide having a high electrical conductivity of about 2000 Ω-cm and able to withstand the harsh operational environment of the plasma in the gap 207. The rings 532, 534 may be formed of other suitable conductive materials, such as aluminum or graphite. The post 538 may be formed of metal.

The confinement ring assembly 246 assists in confining the plasma to the space surrounded by the upper and lower electrode assemblies 202, 212 and by the rings 532, 534, while allowing neutral gas constituents in the gap 207 to pass through the gaps 536 in a generally horizontal direction. Then, neutral gas constituents flow into the space 550 surrounded by the inner surface of the wall 204, the outer surface of the cantilever assembly 210, and the bellows 230. The pressure in the space 550 is controlled by the vacuum pump unit 239 attached to the bottom of the wall 204. As such, the confinement ring assembly 246 separates the gap or plasma excitation region 207 from the space 550. In general, the volume of the gap region 207 is small compared to that of the space 550. Because the etch rate of the substrate is directly affected by the plasma in the gap 207, the assembly 246 enables a small volume pressure control and plasma confinement over the entire range of the gap 207 without major physical change to the chamber hardware. Also, as the volume of the gap 207 is small, the plasma conditions can be controlled quickly and accurately.

Upon repeated use of the upper electrode assembly 202 and lower electrode assembly 212, the electrode surfaces facing the plasma are gradually eroded by the plasma. The gap 207 can be adjusted to compensate for wear of the electrodes so that the process repeatability is maintained, and thereby the lifetime of the electrode is extended and cost of consumables is lowered.

While the invention has been described in detail with reference to specific embodiments thereof, it will be apparent to those skilled in the art that various changes and modifications can be made, and equivalents employed, without departing from the scope of the appended claims.

What is claimed is:

1. A method of processing a semiconductor substrate, comprising:
supporting a semiconductor substrate on the substrate support in a plasma processing apparatus comprising: a chamber comprising a wall separating the interior of the chamber into first and second regions, the wall having an opening therein providing fluid communication between the first and second regions; a cantilever assembly comprising an arm unit extending horizontally through the opening such that a first end is in the first region and a second end is in the second region, a substrate support being located on an upper portion of the first end and a service conduit being located at the second end; an actuation mechanism coupled to an upper portion of the service conduit and operative to move the cantilever assembly in a vertical direction; wherein: the substrate support comprises a lower electrode assembly having a top surface adapted to support a substrate; the plasma processing chamber further comprises an upper electrode assembly having a bottom surface facing and spaced from the top surface of the substrate support to form a gap therebetween; the lower electrode assembly is coupled to a radio frequency (RF) power supply via an RF transmission member located in the arm unit; and a dual bellows arrangement providing a balanced atmospheric load on the interior of the chamber, the dual bellows including a first bellows providing a vacuum seal between an upper part of the chamber and the upper portion of the service conduit and a second bellows providing a vacuum seal between a lower part of the chamber and a lower portion of the service conduit;
generating plasma in the space between the upper and lower electrode assemblies;
adjusting the gap by moving the cantilever assembly via the actuation mechanism, the atmospheric load on the cantilever assembly being neutralized during the adjusting; and
processing the semiconductor substrate with the plasma.

2. The method of claim 1, wherein the processing comprises plasma etching.

3. A plasma processing chamber for processing a substrate wherein a wall separates the interior of the chamber into first and second regions in fluid communication via an opening in the wall, comprising:
an actuation mechanism mounted on the chamber;
an arm unit configured to extend horizontally through the opening such that a first end is in the first region and a second end is in the second region, a substrate support being located on an upper portion of the first end and a service conduit being located at the second end;
an actuation member adapted to cooperate with the actuation mechanism, the actuation member being located at an upper portion of the service conduit and operative to be driven such that the arm unit moves in a vertical direction.

4. The plasma processing chamber of claim 3, wherein the service conduit extends in a vertical direction and includes vacuum seal locations at upper and lower portions thereof and a bellows providing vacuum seal between the chamber and the service conduit at each of the vacuum seal locations.

5. The plasma processing chamber of claim 3, wherein: (a) the substrate support includes an RF driven lower electrode and the service conduit includes a housing at the upper portion thereof, the housing containing circuitry providing an RF match for the electrode; (b) the service conduit includes at least one gas line operable to supply backside cooling to a substrate mounted on the substrate support: (c) at least one electrical connection operable to transmit signals from a sensor located in the substrate support: and/or (d) a fluid passage operable to circulate a heat transfer liquid in the substrate support.

6. A capacitively-coupled plasma processing chamber comprising:
an upper electrode assembly and a wall surrounding an interior region in which a semiconductor substrate undergoes plasma processing
a cantilever assembly including a lower electrode at a first end, a substrate support surface at the first end and an actuating member at a second end, the cantilever assembly extending horizontally through an opening in the wall such that the first end is inside the interior region and the second end is outside the interior region; and
an actuation mechanism engaging the actuating member such that the cantilever assembly moves vertically to adjust an inter-electrode gap between the upper electrode assembly and the lower electrode.

7. The plasma processing chamber apparatus of claim 6, further comprising two bellows connected to an end of the cantilever assembly outside the interior region, the bellows providing vacuum isolation for the space inside the interior region and outside the interior region such that an atmospheric load on the cantilever assembly is neutralized.

8. The plasma processing chamber of claim 6, wherein:
the lower electrode is coupled to a radio frequency (RF) power supply via an RF transmission member located in the cantilever assembly.

9. The plasma processing chamber of claim 6, wherein the lower electrode comprises an electrostatic chuck operable to clamp the substrate in place during plasma processing.

10. The plasma processing chamber of claim 6, wherein:
the cantilever assembly comprises an internal cavity; and
the plasma processing chamber further comprises:
an RF tube located in the cavity and having one end coupled to an RF power supply and being operative to transmit RF power from the RF power supply therethrough; and
an RF conductor coupled to the other end of the RF tube and being operative to collect the RF power and to send the RF power to the lower electrode.

11. The plasma processing chamber of claim 6, further comprising at least one flexible conductor connected between the cantilever assembly and the wall.

12. The plasma processing chamber of claim 7, wherein: (a) the cantilever assembly includes a service unit which extends in a vertical direction and is open at the bottom thereof and/or (b) a first bellows is stretched while a second bellows is compressed when the cantilever assembly is moved upward by the actuation mechanism.

13. The plasma processing chamber of claim 6, wherein: the actuation mechanism comprises:
   a ball screw rotatably secured to the cantilever assembly and operative to move the cantilever assembly when rotated; and
   a motor for rotating the ball screw.

14. The plasma processing chamber of claim 6, wherein:
   the upper electrode assembly comprises at least one baffle for supplying process gas into the gap; and
   an RF power supply is operable to supply RF power to the lower electrode to excite the process gas to produce plasma.

15. The plasma processing chamber of claim 6, further comprising a confinement ring assembly including at least one confinement ring configured to encircle the gap and thereby confine the plasma in the gap.

* * * * *